(12) United States Patent
Himmer

(10) Patent No.: US 10,074,790 B2
(45) Date of Patent: Sep. 11, 2018

(54) THERMOELECTRIC DEVICE

(71) Applicant: MAHLE International GmbH, Stuttgart (DE)

(72) Inventor: Thomas Himmer, Reichenbach (DE)

(73) Assignee: MAHLE International GmbH, Stuttgart (DE)

( * ) Notice: Subject to any disclaimer, the term of this patent is extended or adjusted under 35 U.S.C. 154(b) by 7 days.

(21) Appl. No.: 14/619,750

(22) Filed: Feb. 11, 2015

(65) Prior Publication Data
US 2015/0171302 A1 Jun. 18, 2015

Related U.S. Application Data

(63) Continuation of application No. PCT/EP2013/066973, filed on Aug. 14, 2013.

(30) Foreign Application Priority Data

Aug. 17, 2012 (DE) .......................... 10 2012 214 701

(51) Int. Cl.
*H01L 35/30* (2006.01)
*F01N 5/02* (2006.01)
*H01L 35/32* (2006.01)

(52) U.S. Cl.
CPC .............. *H01L 35/30* (2013.01); *F01N 5/025* (2013.01); *H01L 35/32* (2013.01); *Y02T 10/16* (2013.01)

(58) Field of Classification Search
CPC ....... H01L 35/32; H01L 35/34; H01L 31/024; H01L 31/0248; H01L 31/052; H01L 35/30; H02S 10/30; H02S 10/40; F01N 5/025; Y02T 10/166
See application file for complete search history.

(56) References Cited

U.S. PATENT DOCUMENTS

| | | | |
|---|---|---|---|
| 3,539,399 | A | 11/1970 | Harvey |
| 6,474,060 | B2 | 11/2002 | Khair |
| 7,100,369 | B2 | 9/2006 | Yamaguchi et al. |
| 7,612,446 | B2 | 11/2009 | Dang et al. |

(Continued)

FOREIGN PATENT DOCUMENTS

| | | |
|---|---|---|
| CN | 101188217 A | 5/2008 |
| CN | 101515628 A | 8/2009 |

(Continued)

OTHER PUBLICATIONS

English translation of FR 2,972,570 A1 (Year: 2018).*

(Continued)

*Primary Examiner* — Devina Pillay
*Assistant Examiner* — Daniel P Malley, Jr.
(74) *Attorney, Agent, or Firm* — Muncy, Geissler, Olds & Lowe, P.C.

(57) ABSTRACT

A thermoelectric device is provided that includes a duct through which a first fluid can flow. The duct has first walls and side walls which connect the first walls. At least one first wall is in thermal contact with a thermoelectric module which has a housing with at least two opposite second walls. A plurality of thermoelectric elements is arranged between the second walls. The thermoelectric elements have opposite surfaces, each of which is in thermal contact with one of the second walls of the housing of the thermoelectric module.

16 Claims, 14 Drawing Sheets

(56) References Cited

U.S. PATENT DOCUMENTS

| | | |
|---|---|---|
| 8,110,736 B2 | 2/2012 | Iwanade et al. |
| 9,291,375 B2 | 3/2016 | Brehm et al. |
| 2004/0076214 A1* | 4/2004 | Bell .................. F02G 1/043 374/13 |
| 2008/0047598 A1* | 2/2008 | Lofy .................. B60N 2/5635 136/203 |
| 2009/0236087 A1 | 9/2009 | Horio |
| 2010/0031987 A1 | 2/2010 | Bell et al. |
| 2011/0197941 A1* | 8/2011 | Dannoux ............. F01N 5/025 136/201 |

FOREIGN PATENT DOCUMENTS

| | | |
|---|---|---|
| CN | 101553704 A | 10/2009 |
| CN | 102239579 A | 11/2011 |
| DE | 40 06 861 A1 | 9/1991 |
| DE | 10 2006 037 540 A1 | 2/2007 |
| DE | 10 2006 040 283 A1 | 3/2007 |
| DE | 10 2009 013 535 A1 | 9/2010 |
| DE | 10 2009 025 033 | 12/2010 |
| DE | 10 2009 046 318 A1 | 5/2011 |
| EP | 1 475 532 A2 | 11/2004 |
| EP | 1 522 685 A1 | 4/2005 |
| EP | 1 230 475 B1 | 3/2006 |
| EP | 2 230 701 A2 | 9/2010 |
| EP | 2230701 A2 * | 9/2010 ............ H01L 35/30 |
| EP | 2 262 018 A2 | 12/2010 |
| FR | 2972570 A1 * | 9/2012 ........... F28D 7/0033 |
| JP | H 10-281015 A | 10/1998 |
| JP | 2000-282960 A | 10/2000 |
| JP | 2003-204087 A | 7/2003 |
| JP | 2004-068608 A | 3/2004 |
| JP | 2005-083251 A | 3/2005 |
| JP | 2005-117836 A | 4/2005 |
| JP | 2008-277584 A | 11/2008 |
| JP | 2009-260173 A | 11/2009 |
| RU | 2 142 177 C1 | 11/1999 |
| WO | WO 98/56047 A1 | 12/1998 |
| WO | WO 2007/026432 A1 | 3/2007 |
| WO | WO 2010051219 A1 * | 5/2010 ............ F01N 5/025 |
| WO | WO 2011/082912 A | 7/2011 |

OTHER PUBLICATIONS

Chinese Office Action for Chinese Application No. 201380043859.4 dated Aug. 1, 2016 with English translation.
Chinese Office Action for Chinese Application No. 201380043912.0 dated Aug. 25, 2016 with English translation.
Chinese Office Action for Chinese Application No. 201380043859.4 dated Feb. 27, 2017 with English translation.
U.S. Appl. No. 14/619,622, filed Feb. 11, 2015.
U.S. Appl. No. 14/619,684, filed Feb. 11, 2015.

* cited by examiner

THERMOELECTRIC DEVICE

This nonprovisional application is a continuation of International Application No. PCT/EP2013/066973, which was filed on Aug. 14, 2013 and which claims priority to German Patent Application No. 10 2012 214 701.2, which was filed in Germany on Aug. 17, 2012 and which are both herein incorporated by reference.

BACKGROUND OF THE INVENTION

Field of the Invention

The present invention relates to a thermoelectric device having a flow channel, through which a first fluid can flow, whereby the flow channel has first walls and side walls connecting the first walls, whereby at least one first wall is in thermal contact with a thermoelectric module. In addition, the invention relates to an arrangement of a thermoelectric device in a heat exchanger.

Description of the Background Art

In motor vehicles a major part of the energy stored in fuel is converted to heat. Apart from being used for heating the interior, for example, the heat is also released partially unused via the exhaust gas.

This has a negative influence on the overall efficiency of the vehicle. In order to increase the efficiency and thereby to reduce $CO_2$ emissions during operation, it is worthwhile to make the energy bound in the exhaust gas utilizable.

The use of thermoelectric devices is necessary to achieve this. These thermoelectric devices have thermoelectrically active materials, which allow the generation of electrical energy. To this end, the thermoelectric materials at their interfaces, and thereby preferably at two opposite interfaces, are exposed to a temperature difference.

The exhaust gas which flows through the exhaust gas line lends itself as a hot source particularly in motor vehicles. The exhaust gas temperature are sufficiently high over the entire exhaust gas line, so that a thermoelectric device can be integrated at various locations in the exhaust gas line.

A coolant stream of the vehicle, for example, lends itself for a cold source. For this purpose, either an already present coolant circuit can be expanded, or if necessary an additional circuit can be integrated.

The publications EP 1230475 B1 (which corresponds to U.S. Pat. No. 6,474,060), EP 1475532 A2 (which corresponds to U.S. Pat. No. 7,100,369), WO 2007026432, JP 10281015AA, JP 2000282960AA, JP 2004068608AA, JP 2005083251AA, or JP 2005117836AA disclose approaches by using such a thermoelectric device; however, these implementations are less efficient because of the disadvantageous connection of the thermoelectric elements to a heat exchanger.

To assure an especially efficient use of a thermoelectric device, it is very important that the individual thermoelectric elements are thermally connected especially advantageously to the fluids. In particular, a low heat transfer coefficient is advantageous to be able to produce the maximum benefit from the temperature difference of the two fluids, or in an alternative design to realize the most effective heat pump possible with as low a current consumption as possible.

At present particularly disadvantageous in the prior art is the connection of the thermoelectric elements to the fluid-conveying thermoelectric devices, particularly with respect to a lowest possible thermal resistance between the fluids and the thermoelectrically active materials. Disadvantageous in addition is the resistance to thermal stresses in the connecting material or the thermoelectric modules. Furthermore, the integratability of the thermoelectric modules in a device has not been optimally resolved thus far.

SUMMARY OF THE INVENTION

It is therefore an object of the present invention to provide a thermoelectric device that produces a lowest possible thermal resistance between the fluids and the thermoelectric elements and is also not sensitive to thermal stresses and enables simple integratability of the thermoelectric device into a heat exchanger. In addition, an arrangement is provided of a single or plurality of thermoelectric devices in a heat exchanger.

An exemplary embodiment of the invention relates to a thermoelectric device having a flow channel, through which a first fluid can flow, whereby the flow channel has first walls and side walls connecting the first walls, whereby at least one first wall is in thermal contact with a thermoelectric module, the thermoelectric module has a housing with at least two opposite second walls, whereby a plurality of thermoelectric elements are arranged between the second walls, whereby the thermoelectric elements have opposite surfaces, which in each case are in thermal contact with one of the second walls of the housing of the thermoelectric module.

The thermoelectric elements here can be enclosed in a housing and combined to form a thermoelectric module. In this design, a plurality of thermoelectric elements can be easily exposed to a temperature gradient, in that an interface of the housing adjoining the thermoelectric elements is exposed to a fluid with a specific temperature and the housing interface, opposite the interface, of the housing is exposed to a second fluid with a temperature different from that of the first fluid.

By the thermal connection of the housing to the flow channel, the first fluid flowing in the flow channel can be advantageously concentrated, so that an exposure, as long and uniform as possible, of the housing interfaces to the fluid flow is achieved.

In an embodiment, instead of recovering energy by the application of a temperature difference to the thermoelectric modules, a heat transport can also be achieved by the application of an electrical voltage to the thermoelectric elements.

Advantageously, the temperature difference between the fluid flowing in the flow channel and the fluid flowing around the housing interface facing away from the flow channel is as great as possible. In this case, the use of an exhaust gas stream from an internal combustion engine as one of the two fluids and a fluid with a lower temperature, for example, a coolant circuit, as a second fluid is advantageous.

In addition, the flow channel can have two opposite first walls, each of which is in thermal contact with a thermoelectric module.

This is advantageous, because this assures that the temperature of the fluid in the flow channel is also transferred to the thermoelectric module. In order for the inventive function of the thermoelectric module to have a temperature gradient at the opposite interfaces between which the thermoelectric elements are arranged, it is advantageous to assure an advantageous thermal connection of the flow channel to the thermoelectric module.

In an embodiment, the first wall and the second wall can be formed separated from one another and to be in thermal contact to one another, or the first wall and the second wall to be formed as a unit.

In case that the first and second wall are formed separately, a thermal contact between them is especially advantageous, because thus a temperature control as loss-free as possible of the thermoelectric module is possible, which contributes to a temperature gradient as large as possible across the thermoelectric module, since the temperature losses from the first fluid to the thermoelectric module are minimized by a good thermal connection.

In the case of the formation of the first and second wall as a single unit, the thermal connection is even more optimal, as the thermal resistance of a wall is usually lower than the thermal resistance of two walls adjacent to one another.

In a further embodiment, the side walls can have a thermal decoupling element.

The thermal decoupling element creates additional thermal insulation to the side areas of the flow channel, which are not directly adjacent to the thermoelectric module. This in particular prevents heat radiation losses.

In an embodiment, the thermal decoupling elements can have an air-filled hollow space, which has an additional insulation effect. The thermal decoupling element in this case can be formed, inter alia, as a punched part, or be produced by the use of shaped wire pieces, for example.

The first walls can have cutouts.

The thermal resistance between the fluid flowing in the flow channel and the thermoelectric elements in the thermoelectric modules is also reduced by the cutout; this has a positive effect on the efficiency of the thermoelectric device.

In addition, the first wall and/or the second wall can have flow resistance elements projecting into the flow channel.

The heat transfer from the fluid to the thermoelectric module is improved by the flow resistance elements. The area of the thermoelectric module exposed to the fluid is increased by the flow resistance elements, which improves the heat transfer.

It is expedient, furthermore, if the first wall and the second wall that are formed as a unit, have at least one cutout, whereby the cutout is closed fluid-tight via a sealing element.

The cutout of the first and second wall formed as a unit can be used for equalizing thermal stresses. Because one of the two fluids, preferably the fluid within the flow channel, has very high temperatures, thermal stresses can occur in the wall of the flow channel. In the case of the first and second wall formed as a unit, the unit forms both the boundary of the flow channel and the boundary of the thermoelectric module.

The thermoelectric elements are arranged on the side of the wall, the side facing away from the flow channel, so that thermal stresses are transferred to the thermoelectric elements. A reduction of the thermal stresses can be achieved by the cutout, which can be made advantageously as an arrangement of expansion joints.

The flow channel can be formed as a flat tube made of plate-like elements in a stacked configuration or as a one-piece flat tube.

Both embodiments are suitable for use in a thermoelectric device of the invention. A one-piece structure has the advantage that there are no connecting sites from which leaks can occur, for example. Flat tubes in a stacked configuration are especially simple and cost-effective to produce.

It is also advantageous, if the thermoelectric elements are connected in series via conductive bridges, whereby the conductive bridges are arranged between the thermoelectric elements and the second walls.

A series connection of the thermoelectric elements increases the efficiency of the thermoelectric device, as the obtained electrical energy includes an addition of the obtained electrical energy to the individual thermoelectric elements.

The connection of the thermoelectric elements via conductive bridges to the second wall is advantageous, since the conductive bridges function as an intermediate medium, which can perhaps take up arising stresses and thus relieve the sensitive thermoelectric elements.

It is furthermore expedient for the housing of the thermoelectric module to be of a multipart design, whereby the housing is formed substantially by a second wall and a box-like cover, open in the direction of the second wall, or by the first wall and second wall, formed as a unit, and a box-like cover, open in the direction of the second wall.

The production process can be simplified by a multipart design of the housing. In addition, parts such as deep-drawn sheet metal that can be produced especially cost-effectively, can be used.

An exemplary embodiment of the invention relates to an arrangement of one or more thermoelectric devices in a heat exchanger, whereby a first fluid can flow through the flow channel and a second fluid can flow around the outer interfaces of the thermoelectric modules.

The arrangement of the thermoelectric devices in a heat exchanger represents an especially simple manner of use. The thermoelectric devices can be accommodated like customary tubes in a tube sheet of a heat exchanger. In this case, a first fluid can flow through collecting tanks, which are connected to the tube sheets, into the flow channels of the thermoelectric devices. In this regard, a second fluid can flow around the outer surfaces of the thermoelectric devices.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given hereinbelow and the accompanying drawings which are given by way of illustration only, and thus, are not limitive of the present invention, and wherein.

DETAILED DESCRIPTION

Figure 1:
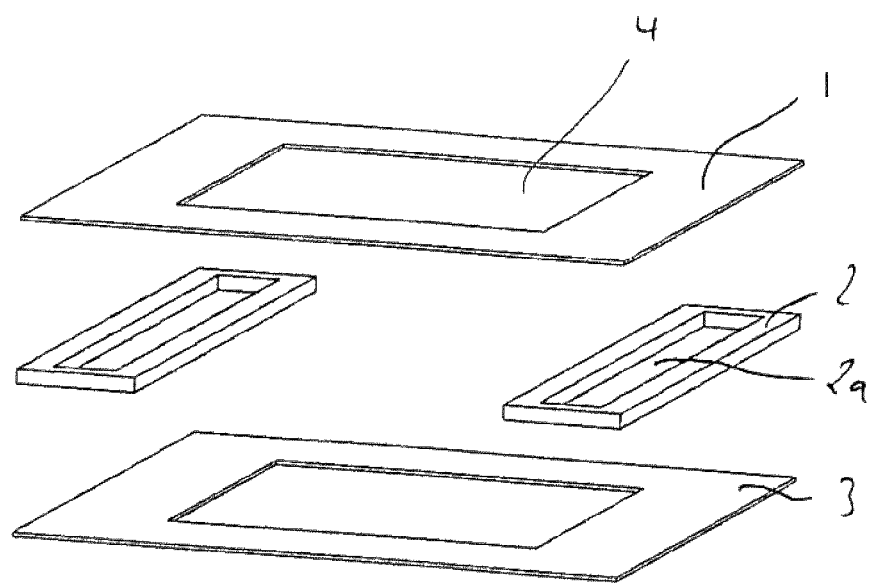
FIG. 1 shows a perspective exploded illustration of a flat tube, which is constructed in a stacked configuration.

FIG. 1 shows a perspective exploded illustration of a flat tube constructed in a stacked configuration. The flat tube has substantially two walls 1, 3, which are opposite to one another. A thermal decoupling element 2 each is arranged laterally between walls 1, 3. The two walls 1, 3 have a cutout 4 in their central area.

Decoupling element 2 in its middle area has a hollow space 2a. In the assembled state of the flat tube, a gap is formed between top wall 1 and bottom wall 3 by thermal decoupling element 2. Hollow space 2a of the thermal decoupling element is covered by both walls 1, 3.

Figure 2:
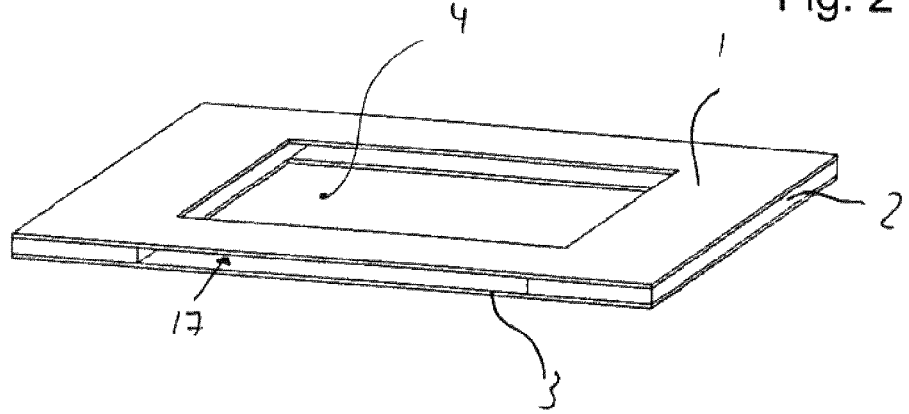
FIG. 2 shows a perspective view of the flat tube of FIG. 1.

FIG. 2 shows the components shown in FIG. 1 in the assembled state. It can be seen here that a flow channel 17 forms that runs through the flat tube between walls 1, 3, which are spaced apart by thermal decoupling element 2. Flow channel 17 is opened upward or downward out of the flat tube by cutout 4 of wall 1, 3.

The connection of walls 1, 3 with thermal decoupling element 2 is fluid-tight and thus prevents escape of a fluid, flowing through flow channel 17, to the sides of the flat tube.

Figure 3:
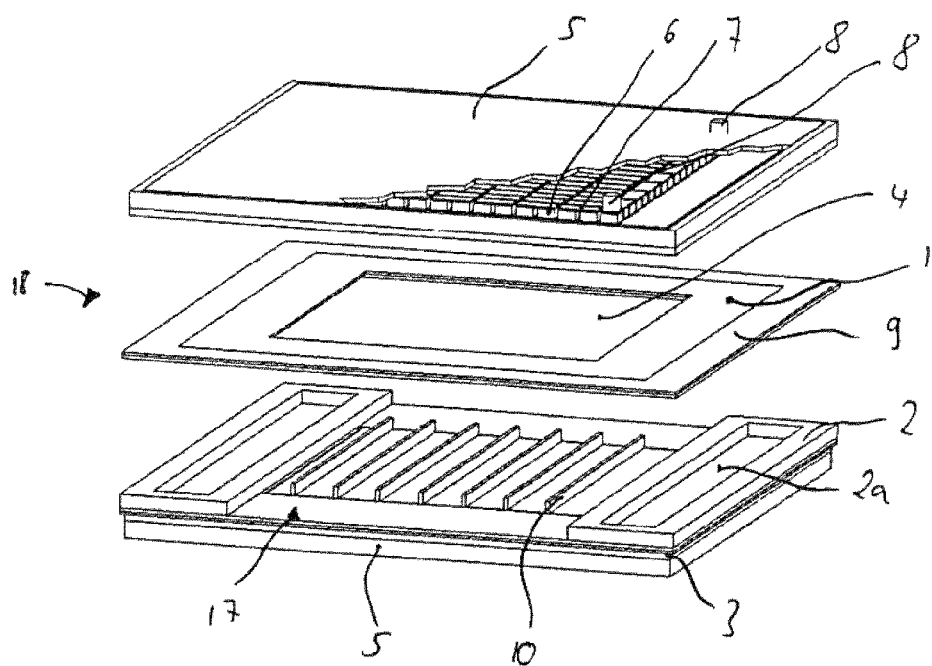
FIG. 3 shows an exploded illustration of a thermoelectric device, with the flat tube shown in FIGS. 1 and 2, which is enclosed above and below by a thermoelectric module.

FIG. 3 shows an exploded illustration of a refinement of the flat tube of FIGS. 1 and 2. In the stacked configuration of the flat tube, a spacing element 9, arranged on the outer periphery of wall 1, is added above wall 1 and below wall 3. In this case, spacing element 9 is arranged on the side of wall 1, 3, the side facing away from flow channel 17. A thermoelectric module 5 is arranged above spacing element 9. The thermoelectric module 5 has in its interior a plurality of thermoelectric elements that are connected to one another via conductive bridges 7. Preferably, the individual thermoelectric elements 6 are connected together here in a series connection.

For the purpose of insulation, the inner surfaces of thermoelectric module 5, particularly if it includes a metallic material, can also have a ceramic coating, which is arranged between the inner surface of thermoelectric module 5 and conductive bridges 7.

Conductive bridges 7 can be formed, inter alia, of copper or silver. Advantageously, in this case, copper-molybdenum 40 (CuMo-40) or copper-molybdenum 50 (CuMo-50) can be used, for example.

Thermoelectric module 5 has on its surface, facing away from flow channel 17, electrical connections 8, with which thermoelectric elements 6 can be connected to an electrical circuit. Thermoelectric module 5, arranged below wall 3, corresponds in its structure to thermoelectric module 5 arranged above wall 1.

Thermoelectric module 5 is spaced apart from wall 1 by spacing element 9 arranged on wall 1. However, since spacing element 9 has a larger cutout than cutout 4 of wall 1, a hollow space forms between the surface of wall 1 and thermoelectric module 5.

After thermoelectric module 5 is placed on spacing element 9, a hollow space surrounding cutout 4 thus forms between thermoelectric module 5 and wall 1.

The hollow space can be used preferably as a receiving volume for a connecting device, which connects thermoelectric module 5 with wall 1. This also applies to the connection for wall 3 with thermoelectric module 5 arranged below wall 3.

The hollow space arising between wall 1, 3 and thermoelectric module 5 offers a defined volume for a connecting device, which can be introduced between thermoelectric module 5 and wall 1, 3.

In addition, the peripheral spacing element 9 insulates and thus produces a thermal drop between the optionally hot fluid, which can flow laterally into flow channel 17, and the connecting device introduced in the hollow space. Furthermore, spacing element 9 also represents protection against optionally corrosive components of the fluid that flows through flow channel 17.

Thermoelectric modules 5 each have on their surface, facing flow channel 17, fin elements 10, which reach through cutout 4 into the interior of flow channel 17. The fins 10 function as flow resistance elements.

Figure 4:
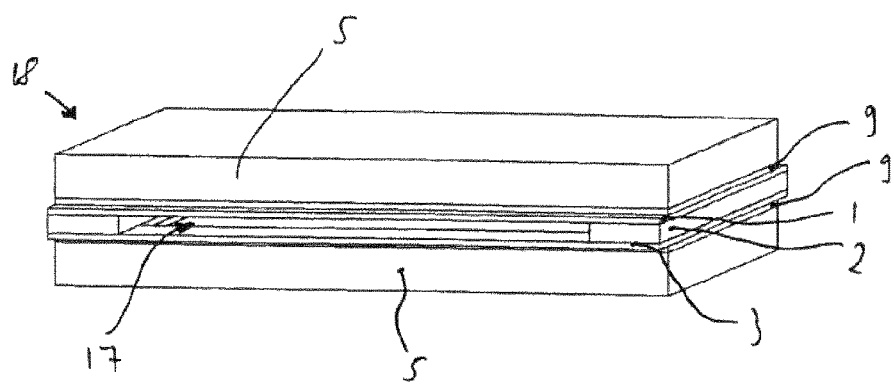
FIG. 4 shows a perspective view of the thermoelectric device illustrated in FIG. 3.

FIG. 4 shows thermoelectric device 18, already shown in FIG. 3 in an exploded illustration, in a final assembled state. It can be seen that the flat tube of thermoelectric device 18 juts out before and after thermoelectric modules 5 in the flow direction of the fluid and thus creates a projection. Thermoelectric device 18 can be inserted with this projection, for example, into the tube sheet of a heat exchanger.

In alternative embodiments, a tube sheet of a heat exchanger can also be designed so that it has passages reaching into the interior of flow channel 17 and thus can accommodate one or more thermoelectric devices 18.

Figure 5:
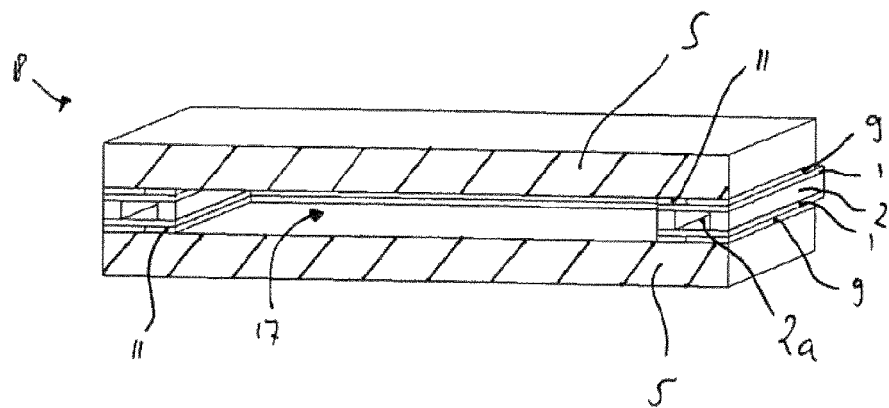
FIG. 5 shows a section through a center plane of the thermoelectric device shown in FIGS. 3 and 4.

FIG. 5 shows a section through thermoelectric device 18 shown in FIGS. 3 and 4. The hollow space, formed by spacing element 9 and filled with a connecting device 11 in FIG. 5, can be seen especially well here. Furthermore, hollow space 2a is visible that is provided in the laterally arranged thermal decoupling elements 2. The hollow space 2a offers additional thermal insulation laterally to the environment. This minimizes the radiation of heat into the environment, as a result of which the efficiency is increased.

Figure 6:
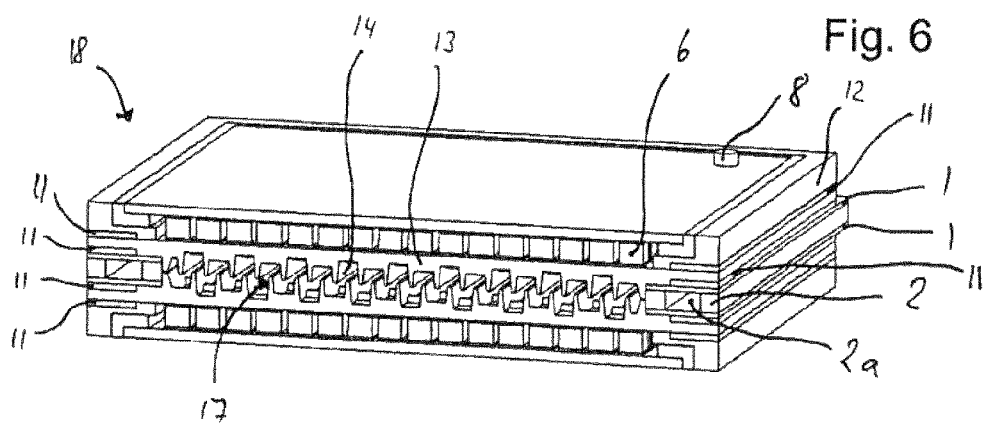
FIG. 6 shows an alternative embodiment of a thermoelectric device, with fins projecting into the flow channel of the flat tube and a multipart structure of the thermoelectric module.

FIG. 6 shows an alternative embodiment of a thermoelectric device 18. Thermoelectric module 5 in FIG. 6 is of multipart design. Thermoelectric elements 6, which are connected to one another in series via conductive bridges 7, are also arranged in the interior of thermoelectric module 5. The thermoelectric module also has an electrical connection 8 to the top. Thermoelectric module 5 has a module frame 12, which towards the top accommodates the top wall of the thermoelectric module and towards the bottom has a shoulder to flow channel 17 that allows a hollow space to form between module frame 12 and bottom wall 13 of thermoelectric module 5. The hollow space is also again used as a receiving volume for connecting device 11.

Bottom wall 13 of thermoelectric module 5 for its part has fin elements 14 formed in the direction of flow channel 17. The fin elements again also fulfill the function of a flow resistance element.

The structure of the top and bottom thermoelectric module 5 is identical in FIG. 6. Thermal decoupling elements 2, which space apart thermoelectric modules 5 from one another and provide for a thermal insulation of flow channel 17 at the sides, are arranged laterally between walls 13 of thermoelectric module 5, each of the walls facing flow channel 17.

Figure 7:
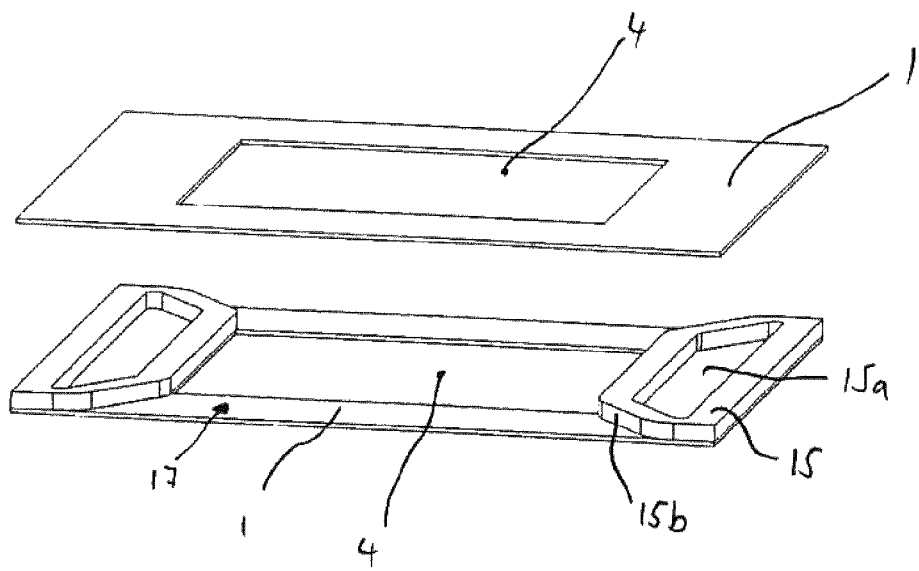
FIG. 7 shows an exploded illustration of an alternative embodiment of a flat tube, with inflow inclines on the lateral thermal decoupling elements.

FIG. 7 shows a further alternative exemplary embodiment for the structure of a flat tube in a stacked configuration. Walls 1 or 3 correspond in structure to walls 1, 3 shown in the previous FIGS. 1 to 5. As a refinement of the previous structure, now thermal decoupling elements 15, which are arranged to the side of flow channel 17, are provided with inflow inclines 15b making the inflow region of flow channel 17 narrower in the direction of the inflowing fluid and similarly again widening it at the exit from flow channel 17.

Thermal decoupling element 15 also has an inner hollow space 15a, which is used for thermal insulation of flow channel 17 towards the side.

Thermal decoupling element 15, as well as thermal decoupling element 2, can be formed preferably by a stamped part.

Figure 8:
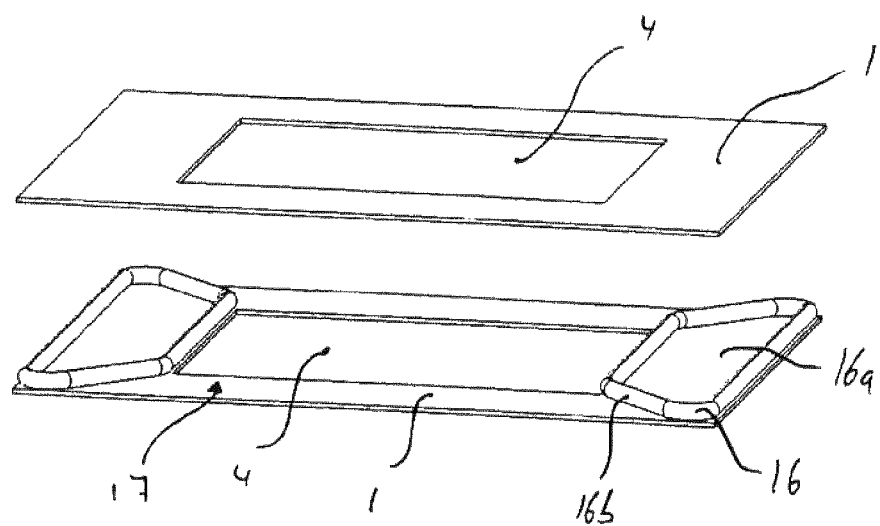
FIG. 8 shows a further exploded illustration of an alternative embodiment of a flat tube, with the lateral thermal decoupling elements constructed from shaped wire pieces.

FIG. 8 also shows an exploded illustration of a flat tube in a stacked configuration. In a departure from the embodiment in FIG. 7, thermal decoupling element 16 is now formed by a shaped wire piece. Decoupling element 16 also has a hollow space 16a that is used for insulation, and inflow inclines 16b, making the inflow region narrower and widening the outflow region accordingly.

Figure 9:
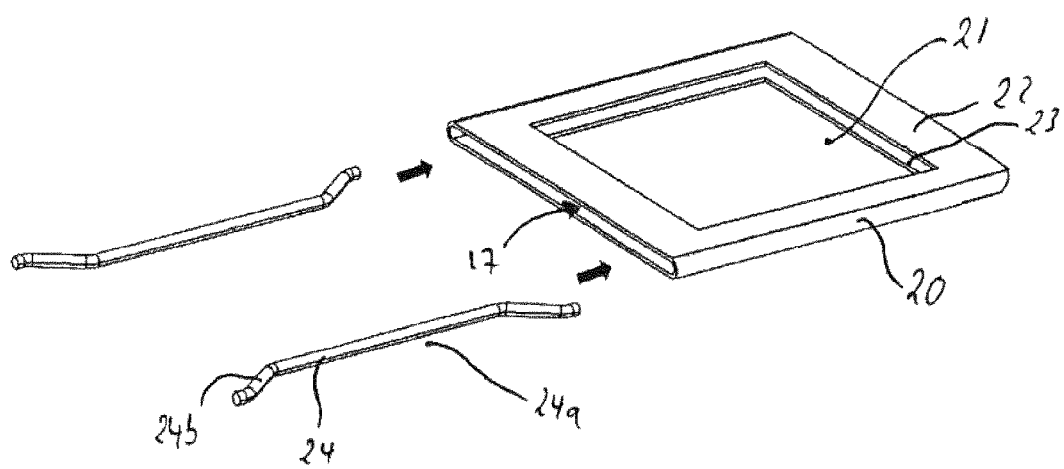
FIG. 9 shows an exploded illustration of a flat tube made as one piece, with thermal decoupling elements that are still to be inserted and that are formed from shaped wire pieces.

FIG. 9 shows an alternative embodiment for the flat tube used within thermoelectric device 18. The flat tube 20 is formed as one piece in FIG. 9. Top wall 22 and bottom wall 23 of flat tube 20 each have a cutout 21. Thermal decoupling elements 24 formed from a shaped wire piece are offset laterally to the illustrated flat tube 20. These can be pushed into flow channel 17, formed by flat tube 20, along the short wall of flat tube 20 and there connected with the inner contours of flat tube 20. A hollow space 24a, which is used for the lateral thermal insulation of flow channel 17, arises by the shaping of thermal decoupling element 24 between thermal decoupling element 24 and the inner wall of flat tube 20.

Thermal decoupling element 24 due to its shaping also has inflow inclines 24b, which accordingly make the inflow region of flow channel 17 narrower and again widen the outflow region.

Figure 10:
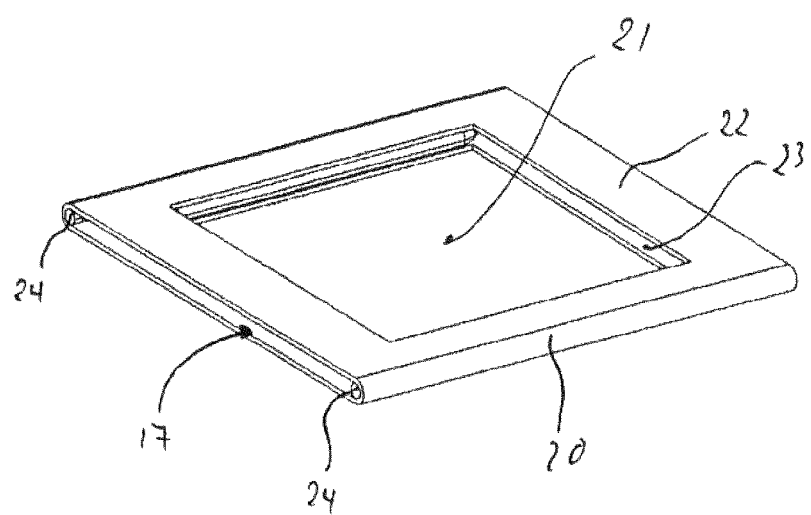
FIG. 10 shows a view of the one-piece flat tube of FIG. 9 with lateral thermal decoupling elements positioned in the flow channel.

FIG. 10 shows the components shown in the exploded illustration of FIG. 9 in the assembled state. Thermal decoupling elements 24 are inserted in flat tube 20 for this purpose, as described in FIG. 9, and connected thereto.

The round shape is especially advantageous in the design of flat tube 20 from FIGS. 9 and 10, because this greatly facilitates the joining process with, for example, a tube sheet of a heat exchanger. Methods such as tack welding, gluing, or soldering, for example, can be used for connecting thermal decoupling elements 24 to flat tube 20.

FIGS. 11 to 14 each show a section through the center plane of a thermoelectric device 18, whose flow channel 17 is formed by a flat tube 20 described in FIG. 9 or 10. The major differences between FIGS. 11 to 14 are based on different connecting techniques between the individual components.

Thermoelectric modules 5 are connected in each case to flat tube 20 at walls 22 and 23 of the flat tube.

Thermoelectric modules 5 have fin elements 32 that are arranged on the outer surfaces of thermoelectric modules 5, the surfaces facing flow channel 17. Because the enveloping body of thermoelectric module 5 in advantageous applications can include ceramic materials such as, e.g., an aluminum oxide ceramic, it can be advantageous to apply a metallization 31 to the enveloping body, in order to create a permanent connection particularly resistant to thermal stresses between metallic fin elements 32 and the ceramic enveloping body of thermoelectric module 5. In addition, reinforcement of the aluminum oxide ceramic can be achieved, for example, by the use of zirconium oxide.

The ceramic enveloping body of thermoelectric module 5 is connected to flat tube 20 via connecting device 30, which can be, e.g., organic adhesives.

Aluminum oxide ceramics or also aluminum nitride ceramics can be used as suitable joining partners in further advantageous embodiments, particularly for the enveloping body of thermoelectric module 5. The material of flat tube 20 can thereby be formed in an advantageous manner from materials such as Kovar, molybdenum, tantalum, or tungsten.

Figure 11:
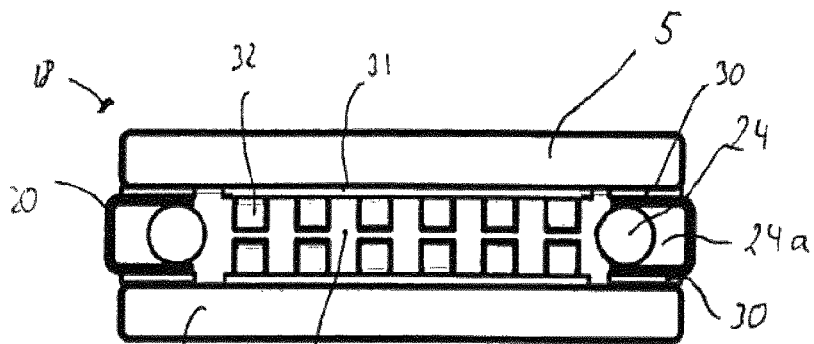
FIGS. 11 to 14 each show a sectional view of a thermoelectric device formed from a one-piece flat tube, as shown in FIGS. 9 and 10, and a thermoelectric module arranged above and below, whereby the employed connecting techniques are different in the figures.
Figure 12:
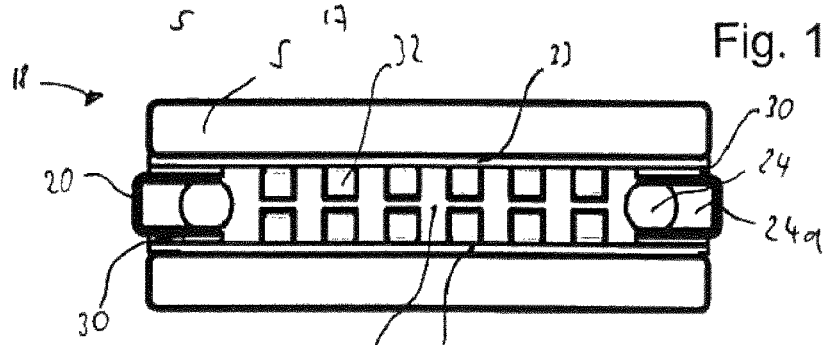

FIG. 12 shows a refinement of thermoelectric device 18 of FIG. 11. As a departure from FIG. 11, a metallization 33 is now applied over the entire width of thermoelectric module 5. Flat tube 20 is thus directly connected with connecting device 24 to metallization 33 of thermoelectric module 5. Fin elements 32 are also connected to metallization 33.

The connection of flat tube 20 to thermoelectric module 5 and fin elements 32 to thermoelectric module 5 can be realized here, for example, via a gluing technique, a soldering technique, or a welding technique.

Figure 13:
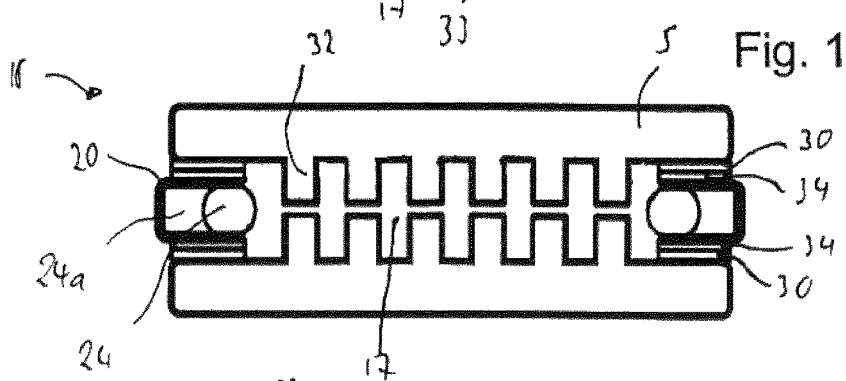

A further design option is shown in FIG. 13. Here, an additional submount metal sheet 34 is used between connecting device 30 and thermoelectric module 5. The submount metal sheet 34 in this case is made, e.g., of a material such as titanium, Kovar, molybdenum, tantalum, or tungsten. This brings about the advantage that flat tube 20 can be produced from a conventional material such as, for instance, stainless steel or a nickel-based alloy.

Submount metal sheet 34 in this case is glued or soldered inorganically on one side to the ceramic material of thermoelectric module 5 and is connected on its opposite side to flat tube 20.

Figure 14:
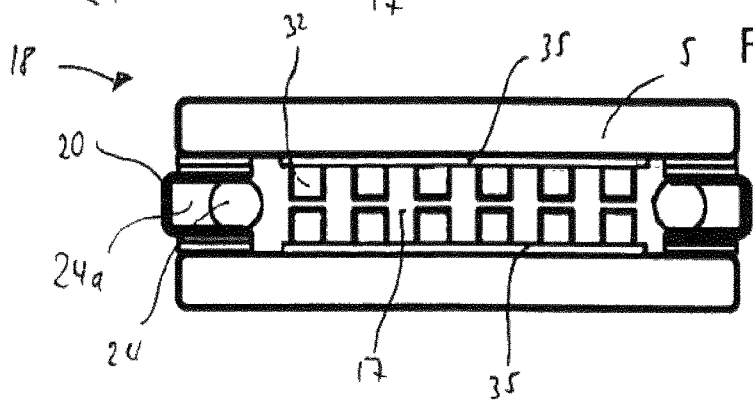

FIG. 14 shows a combination of joining techniques from FIG. 12 and FIG. 13. Here, flat tube 20 is also connected via a submount metal sheet 34 to thermoelectric module 5. At the same time, fin elements 32 are connected to a metallized region 35 of ceramic thermoelectric module 5.

Because the fluid with a first temperature flows through the thermoelectric device for operation and at the same time a second fluid with a second temperature flows around the surface of thermoelectric module 5, the surface facing away from flow channel 17, a temperature gradient arises along thermoelectric module 5. Particularly when the first fluid that flows through flow channel 17 is an exhaust gas of an internal combustion engine, especially high temperature gradients arise hereby between the surface of thermoelectric module 5, the surface facing flow channel 17, and the surface facing away from flow channel 17. This is especially critical, because the surfaces of thermoelectric module 5 exposed to the fluids expand or contract in different ways. Because in the interior of thermoelectric modules 5 thermoelectric elements 6, which are connected to one another via conductive bridges 7, are in thermal contact with the particular interfaces of thermoelectric module 5, the stress that occurs due to the thermal deformation of thermoelectric module 5 is thus transferred to sensitive thermoelectric elements 6 in the interior of thermoelectric modules 5.

This can lead to damage to thermoelectric elements 6 particularly at high temperature gradients. In particular, this puts rigid, brittle, and low-ductile materials and connections at risk. This applies particularly to thick-walled ceramic substrates, soldered areas, and the thermoelectric materials themselves. Therefore, it is not only of particular importance to match the employed different materials of thermoelectric device 18 connected by material bonding with regard to their expansion coefficients for preventing thermomechanical damage, but it is also essential to consider the relevant expansion differences between the hot side of thermoelectric module 5 and the cold side of thermoelectric module 5.

The damage to thermoelectric device 18 can be influenced positively, e.g., by advantageous size dimensioning. The longer the section of thermoelectric device 18 exposed to the fluid, the greater the total expansion of thermoelectric device 18. To minimize the expansion further, it is advisable to use materials with a low expansion coefficient, particularly on the hot side of thermoelectric module 5.

The exemplary embodiments of FIGS. 11 to 14 show possible material combinations and different coatings of the individual elements.

Apart from restricting the structural dimensions of thermoelectric device 18 and the use of suitable materials, the insertion of expansion joints, i.e., the partial interruption of the enveloping body of thermoelectric module 5, can be used as a third option.

Figure 15:
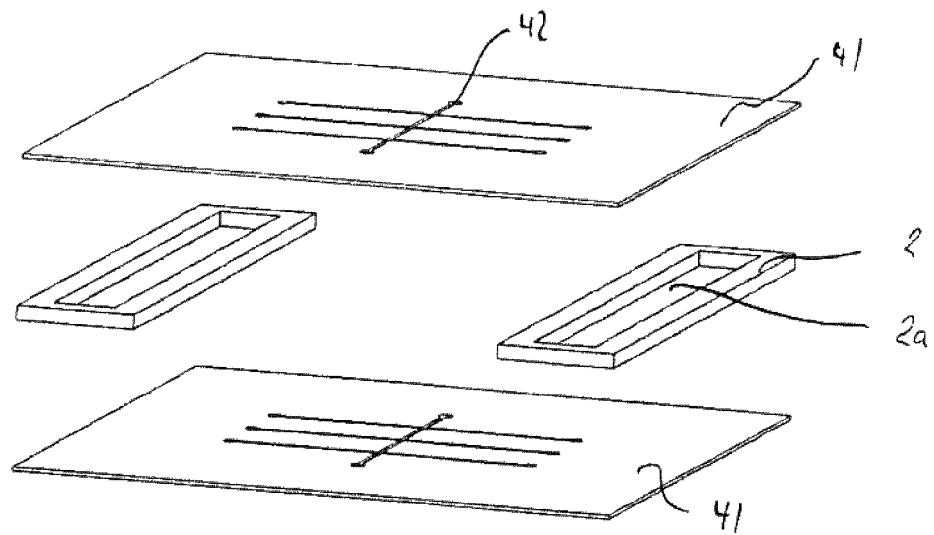
FIG. 15 shows an exploded illustration of a flat tube in a stacked configuration with a top and bottom wall, with cutouts in the walls.

FIG. 15 shows an exploded view of a flat tube in a stacked configuration, similar to the flat tube shown in FIG. 1. The flat tube here is formed substantially of walls 41 and thermal decoupling element 2 arranged therebetween. Walls 41 forming the top and bottom wall of flow channel 17, have cutouts 42.

In the case of FIG. 15, cutout 42 is formed as a cross-shaped pattern of slots. Furthermore, other forms of cutouts can also be used such as single slots that are not connected to one another, for instance.

As a departure from the structure of the flat tube in FIG. 1, walls 41 here form both a wall of flow channel 17 and of the thermoelectric module. The wall of flow channel 17 and the thermoelectric module is therefore realized by a single wall 41 in a structural unit.

The expansion joints serve to reduce thermal stresses arising due to the hot fluid flowing through flow channel 17, particularly in wall 41, in such a way that the thermoelectric elements later mounted on wall 41 are relieved.

Figure 16:
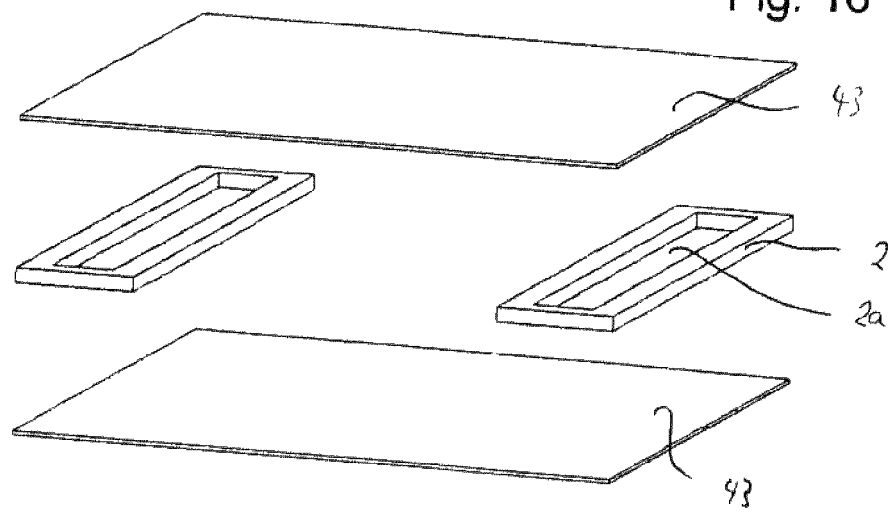
FIG. 16 shows an exploded illustration of an alternative embodiment of a flat tube in a stacked configuration, with walls without cutouts.

FIG. 16 shows a structure similar to FIG. 15, of a flat tube in a stacked configuration. As a departure from wall 41 of FIG. 15, which has expansion joints 42, wall 43 of FIG. 16 has no cutouts or expansion joints 42, but walls 43, like walls 41 in FIG. 15, form both the wall of flow channel 17 as well as the wall of the thermoelectric module.

Figure 17:
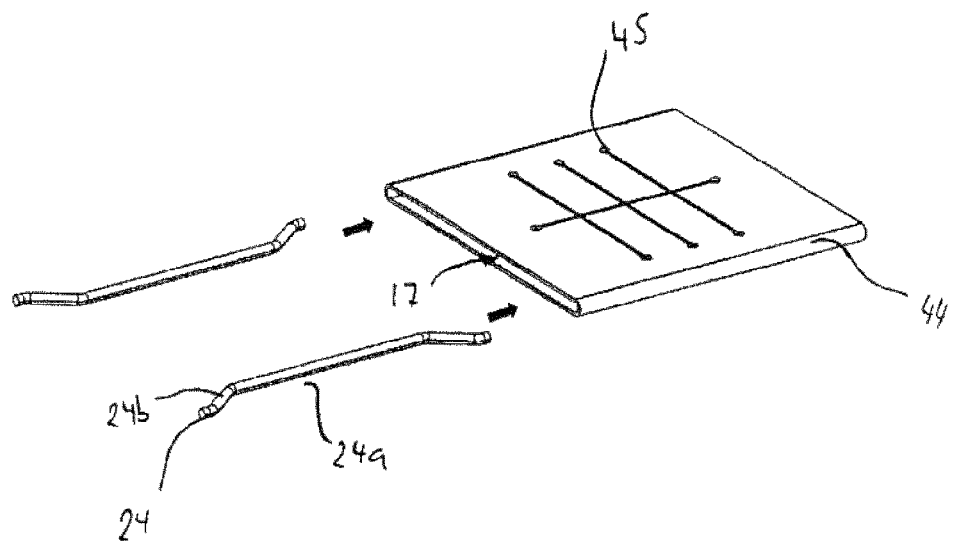
FIG. 17 shows an exploded illustration of a one-piece flat tube with laterally arranged thermal decoupling elements still to be inserted, whereby the top and bottom wall of the flat tube has cutouts.

FIG. 17 shows a one-piece flat tube 44, which on the downward and upward directed walls has cutouts 45, which similar to FIG. 15, are made as expansion joints. The illustration of FIG. 17 corresponds to the illustration of FIG. 9. Thermal decoupling elements 24, which are later inserted into the flat tube and are connected thereto, are shown laterally offset to flat tube 44.

As a departure from the illustration in FIG. 9, the wall of flat tube 44 here as well forms a wall of the thermoelectric module, which is arranged later above and below flat tube 44.

Figure 18:
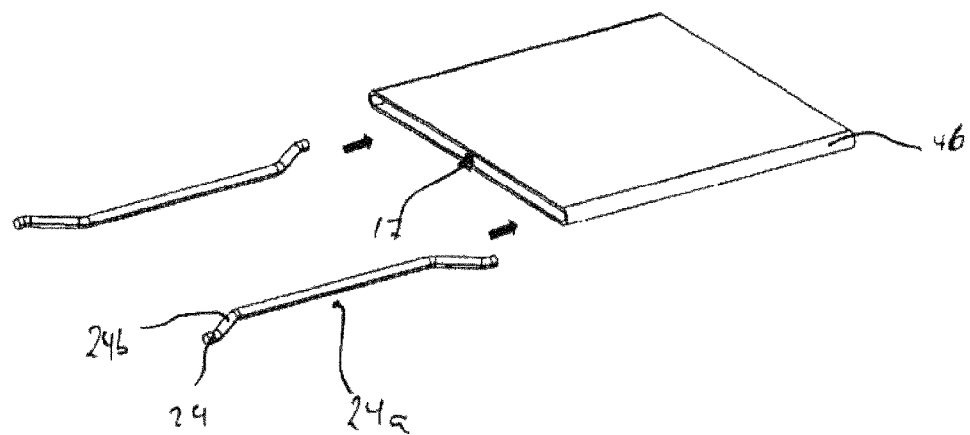
FIG. 18 shows an alternative embodiment of a flat tube according to FIG. 17, whereby the top and bottom wall has no cutout.

FIG. 18, like FIG. 17, shows a flat tube 44, whereby the one-piece flat tube 46 in FIG. 18 has no cutouts or expansion joints 45.

Figure 19:
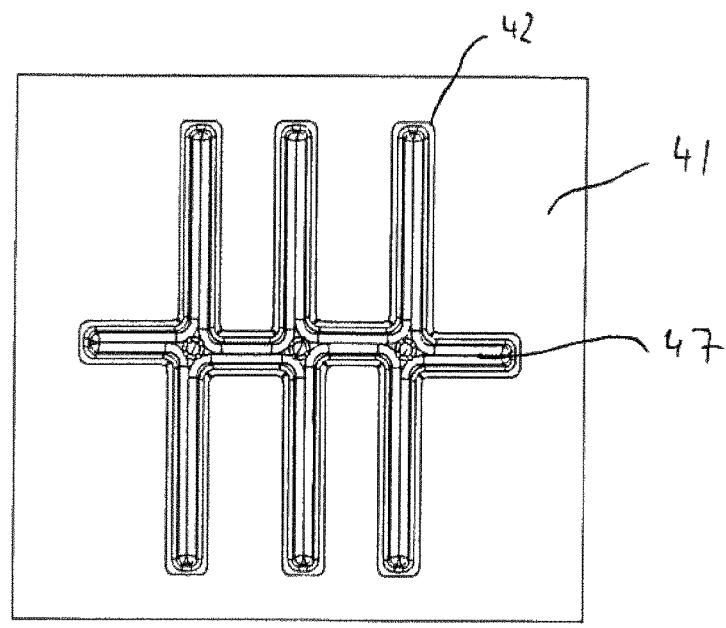
FIG. 19 shows a view of a wall, which can form the top or bottom closure of a flow channel or thermoelectric module, with cutouts in the wall and a sealing element arranged on the back of the wall.

FIG. 19 shows a view of a wall 41, as it is used in FIG. 15, for example, to construct a flat tube in a stacked configuration. Wall 41 has cutouts 42 of a cross-shaped expansion joint pattern. A sealing element 47 is arranged on wall 41 on the side of wall 41, facing away from the viewer.

The sealing element 47 is provided to prevent components of the first fluid, which flows within flow channel 17 through the flat tube, from being able to enter the thermoelectric module. To this end, sealing element 47 is fixedly connected to wall 41 by methods such as, for instance, welding, soldering, or gluing. Advantageously, sealing element 47 is constructed with such thin walls that it can also compensate thermal deformations, which arise along the expansion joints due to the temperature differences in thermoelectric device 18.

In an alternative embodiment, the sealing element can also be provided so that it projects into flow channel 17. Further exemplary embodiments on the arrangement of the sealing element on wall 41 follow in the further figures.

Figure 20:
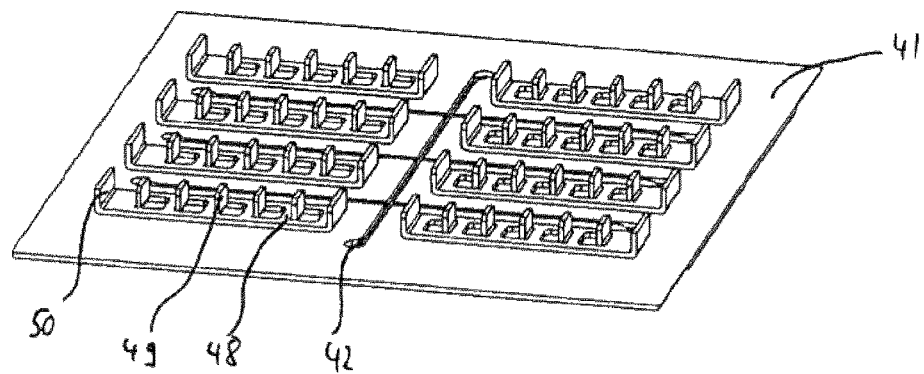
FIG. 20 shows a wall according to FIG. 19, which has flow resistance elements on one of its surfaces.

FIG. 20 also shows a wall 41 that, as already shown in FIGS. 15 and 19, has cutouts 42 which form expansion joints. In addition, wall 41 has a plurality of fin elements 48 arranged on the surface of wall 41.

These fin elements 48 in the exemplary embodiment shown in FIG. 20 have material strips from which individual tabs 49 are bent out and whose edge regions 50 are each raised similar to the bent-out tabs.

In alternative embodiments, fin elements deviating from the form shown in FIG. 20 can also be used. Thus, the use of conventional fin structures is conceivable, or also differently shaped metal strips, e.g., wave-like or with a zigzag shape.

Figure 21:
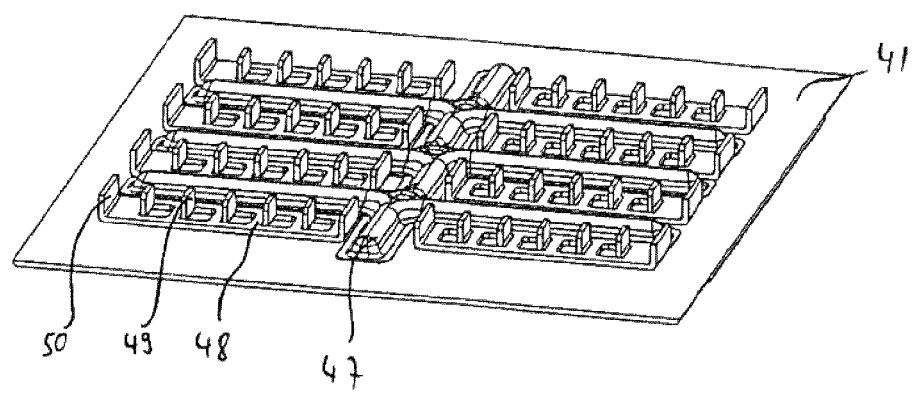
FIG. 21 shows an alternative embodiment of the wall according to FIG. 20, which has a sealing element in addition to flow resistance elements.

FIG. 21 shows a refinement of wall 41 of FIG. 20. In addition to the already described fin elements 48, now a sealing element 47, already described in FIG. 19, is attached to wall 41. It can be seen in particular that fin elements 48 run between the expansion joints, but do not cover them.

Sealing element 47 in FIG. 21 is a deep-drawn metal part having a thin-walled material, so that it can compensate the thermal deformations arising in wall 41 due to the thermal stresses.

The following FIGS. 22 to 25 now show different embodiments of a thermoelectric device 18, whereby in each case flat tubes in a stacked configuration with walls 41 with expansion joints 42 are employed or a flat tube 20, 44, made as a single part, as was already described in the previous figures.

Figure 22:
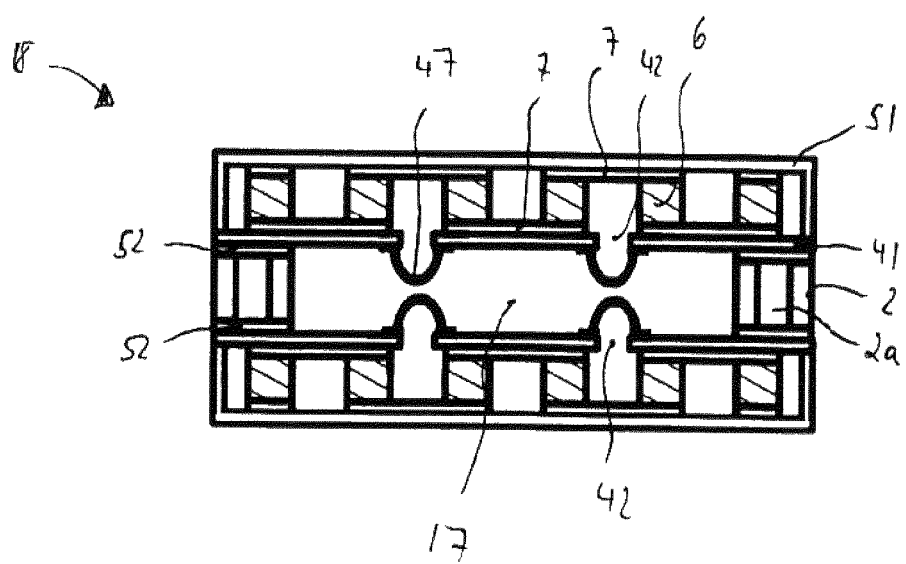
FIGS. 22 and 23 show a section through a flat tube in a stacked configuration, with an arrangement of a thermoelectric module above and below the flat tube, whereby each wall facing the flow channel of the thermoelectric module forms the wall of the flow channel.

FIG. 22 shows a structure of a thermoelectric device 18, whereby wall 41 as a unit forms both the wall of thermoelectric module 5 and of the flat tube.

To this end, wall 41 has the already described expansion joints 42, and the top and bottom wall 41 furthermore has a sealing element 47. In the embodiment shown in FIG. 22, sealing element 47 is directed into flow channel 17.

The already described thermoelectric elements 6, which are connected to one another via conductive bridges 7, are arranged on the side, facing away from flow channel 17, of wall 41. It can be seen especially well here that wall 41 represents both the wall of flow channel 17 and of thermoelectric module 5.

The lateral thermal decoupling elements 22 shown in FIG. 22 each have a spacing element 52 above and below, to which wall 41 is attached.

Figure 23:
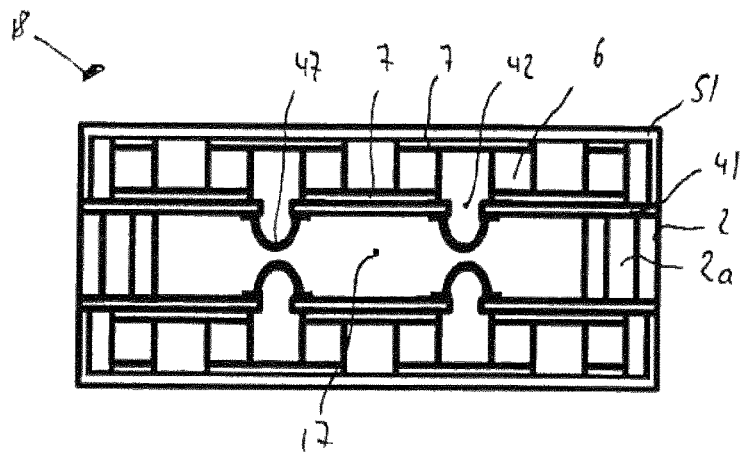

The structure of FIG. 23 substantially corresponds to that of FIG. 22. As a departure from FIG. 22, no spacing elements 52 are now used above and below the lateral thermal decoupling elements 2. Wall 41 here directly adjoins thermal decoupling elements 2.

Figure 24:
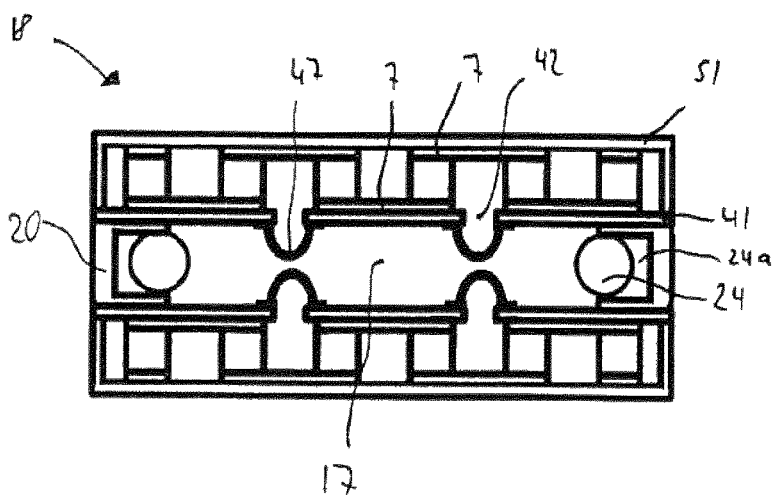
FIG. 24 shows a section through a one-piece flat tube, which has a thermoelectric module above and below, whose wall facing the flow channel has a cutout.

FIG. 24 shows a thermoelectric device 18, whereby flat tube 20 corresponds to flat tube 20 already illustrated in FIGS. 9 and 10. Wall 41 with expansion joints 42 and sealing element 47 is placed on flat tube 20 and connected thereto. The structure of thermoelectric module 5 corresponds to that of FIGS. 22 and 23.

Figure 25:
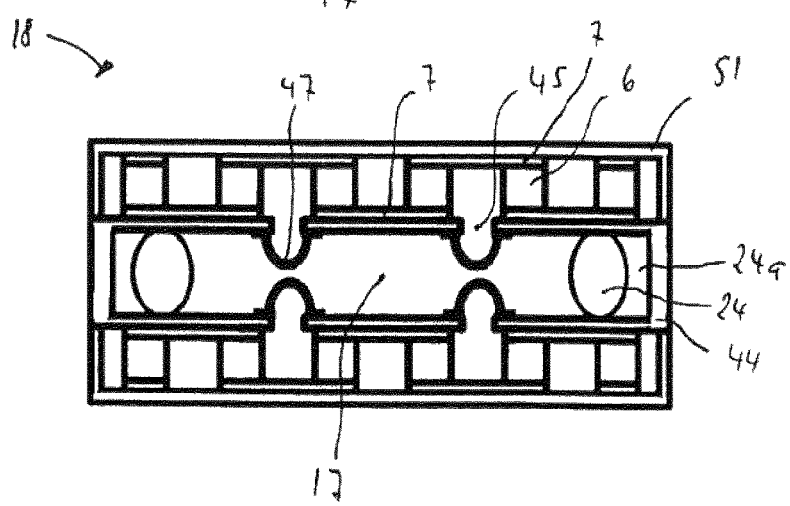
FIG. 25 shows an alternative embodiment of a one-piece flat tube, whereby the top and bottom wall of the flat tube is formed by the wall facing the flow channel of the thermoelectric module.

FIG. 25 shows a further exemplary embodiment, according to the invention, of a thermoelectric device 18. As a departure from the structure in FIG. 24, a flat tube 44 is now used, whereby the wall of the flat tube simultaneously forms the wall of thermoelectric module 5. The wall of flat tube 44 also has cutouts 45 and sealing elements 47, which cover cutouts 45. The further structure of the thermoelectric module corresponds to the previous FIGS. 22 to 24.

Both in FIG. 24 and in FIG. 25, a lateral thermal decoupling element 24 is arranged within flat tube 20, 44, as it was described in FIGS. 9 and 10. In each case a hollow space 24*a*, which is used for thermal insulation, forms between thermal decoupling element 24 and the outer wall of flat tube 20, 44.

Figure 26:
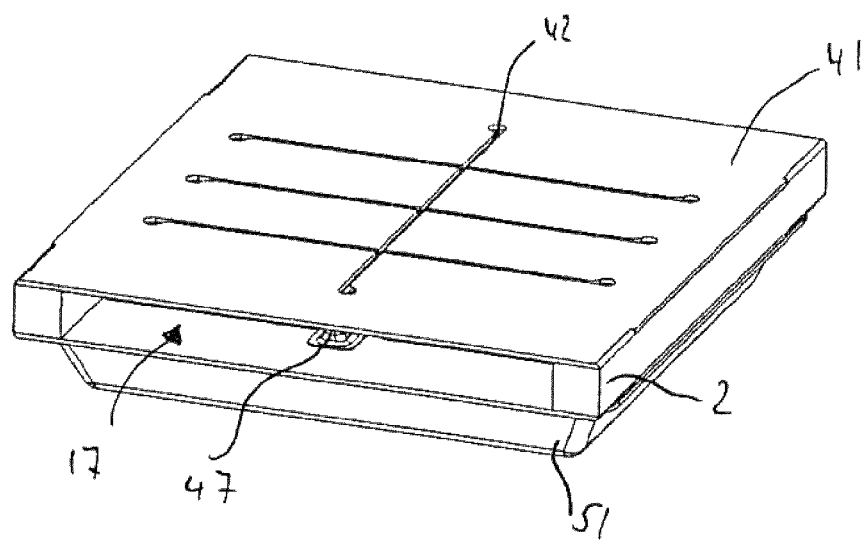
FIG. 26 shows a perspective view of an exemplary embodiment of a thermoelectric device, with a cutout in the wall of the flow channel, whereby the wall also represents a wall of the thermoelectric module.

FIG. 26 shows an incomplete structure of an exemplary embodiment, according to the invention, of a thermoelectric device 18. The incomplete structure shown in FIG. 26 is completed stepwise in FIGS. 27 to 30 and shown in part with the individual variations.

Thermoelectric device 18 of FIG. 26 has a flat tube. The flat tube is constructed in a stacked configuration from two walls 41, which are connected via laterally arranged thermal decoupling elements 2. Walls 41 each have cutouts 42 made as expansion joints in a cross-shaped pattern, as in the previous figures. It can be seen furthermore that walls 41 each have a sealing element 47 in their side facing flow channel 17. The bottom thermoelectric module is shown in FIG. 26. In this case, the housing of the thermoelectric module is formed by cover 51 with wall 41.

Cover 51 in the embodiment shown in FIG. 26 is formed, for example, by a deep-drawn part. Cover 51 is formed of a metallic or ceramic material. The shown walls 41, as in the previous figures, form both the wall of flow channel 17 and the wall of the thermoelectric module facing the flow channel.

Figure 27:
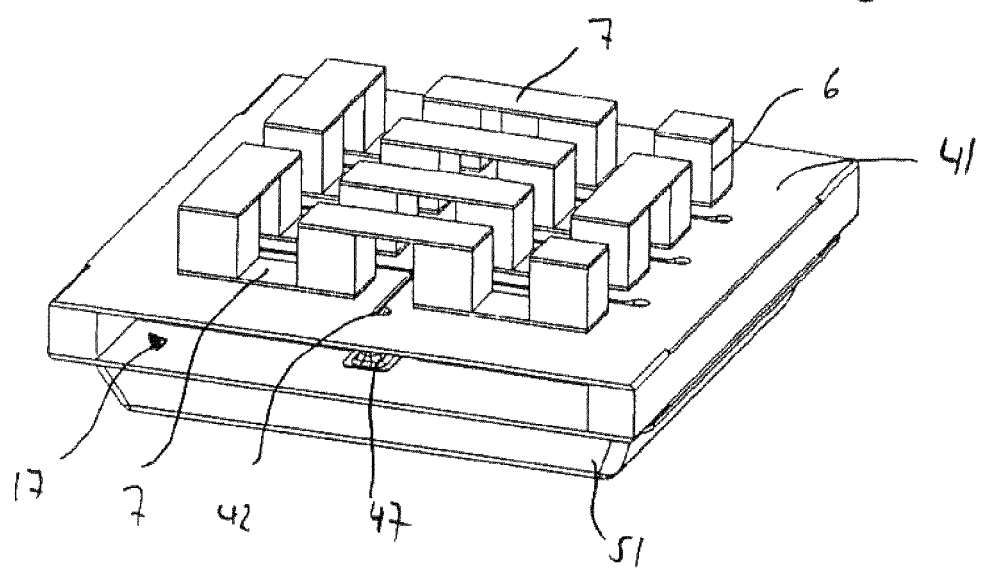
FIG. 27 shows a perspective view of a refinement of the thermoelectric device according to FIG. 26, with thermoelectric elements arranged on the top wall.

FIG. 27 shows a development of FIG. 26. In addition to the structure already shown in FIG. 26, now a plurality of thermoelectric elements 6, which are connected to one another via conductive bridges 7, are arranged on the surface of top wall 41.

The thermoelectric elements and the connecting conductive bridges are arranged on wall 41 such that they do not cover cutouts 42.

Thermoelectric elements 6 are not attached directly to the surface of wall 41, but in each case are in thermal contact with wall 41 via conductive bridges 7.

Each of thermoelectric elements 6 is connected in series to another thermoelectric element 6.

Figure 28:
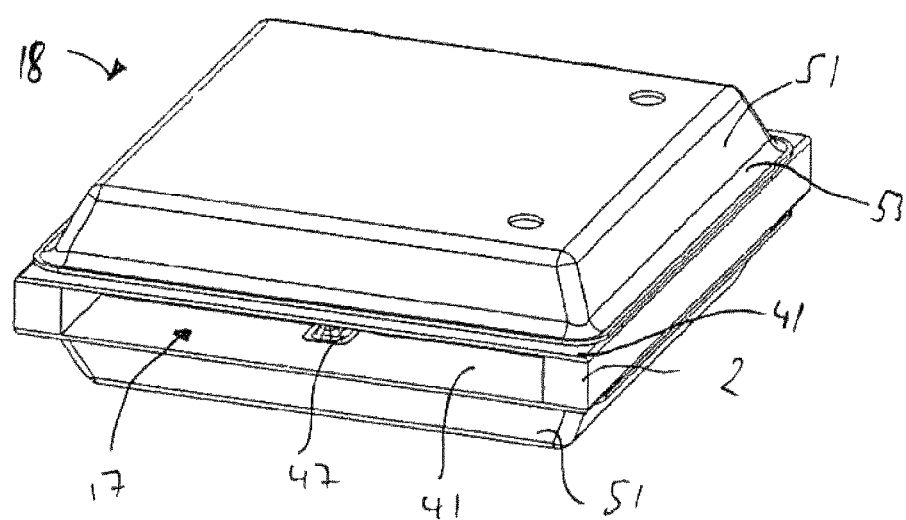
FIG. 28 shows a perspective view of a refinement of the thermoelectric device according to FIG. 27, with a top cover that closes the top thermoelectric module and with the top wall representing a housing of the thermoelectric module.

FIG. 28 shows a further development of the structure of FIGS. 26 to 27. In FIG. 28 the top thermoelectric module as well is now closed by a cover 51. It can be readily seen here that deep-drawn cover 51 has a peripheral flange region 53 with which it lies on wall 41 and thus forms a joining site.

Cover 51 in the shown exemplary embodiment is made conically tapering from its flange region 53, which lies on wall 41.

Figure 29:
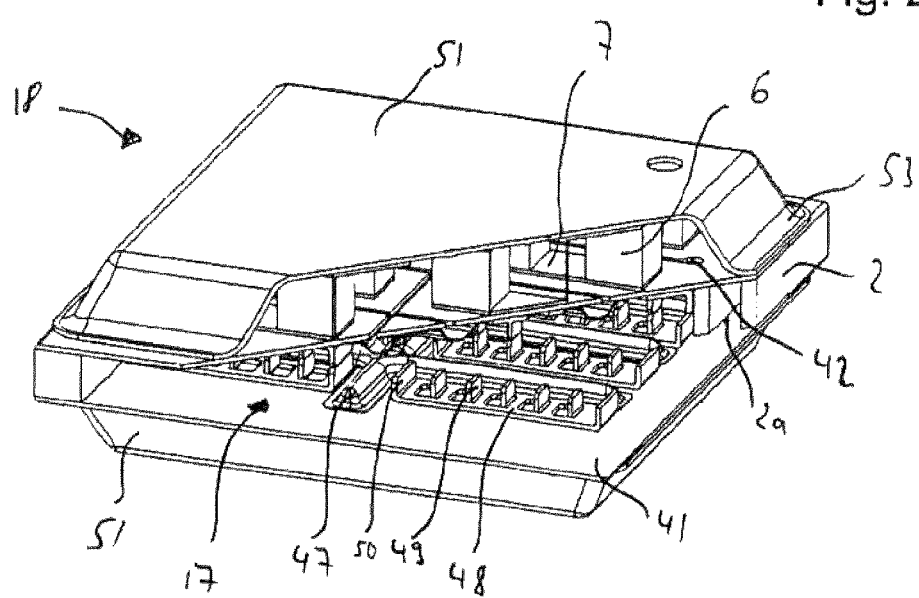
FIG. 29 shows a perspective view of the thermoelectric device as shown in FIG. 28, with a cut across the front corner of the thermoelectric device.

FIG. 29 shows the exemplary embodiment according to FIG. 28. The front corner, facing the viewer, is shown in a cut in FIG. 29, so that the inner structure of thermoelectric device 18 can be seen.

As already described in the previous figures, the surfaces facing flow channel 17 of walls 41 have sealing elements 47, which are constructed as a thin-walled, deep-drawn metal sheet part. In addition to the already described structure, the surfaces facing flow channel 17 also have fin elements 48, as they were already described in FIG. 21.

In the cut, hollow space 2*a* can also be recognized, which is formed in the interior of thermal decoupling element 2.

Figure 30:
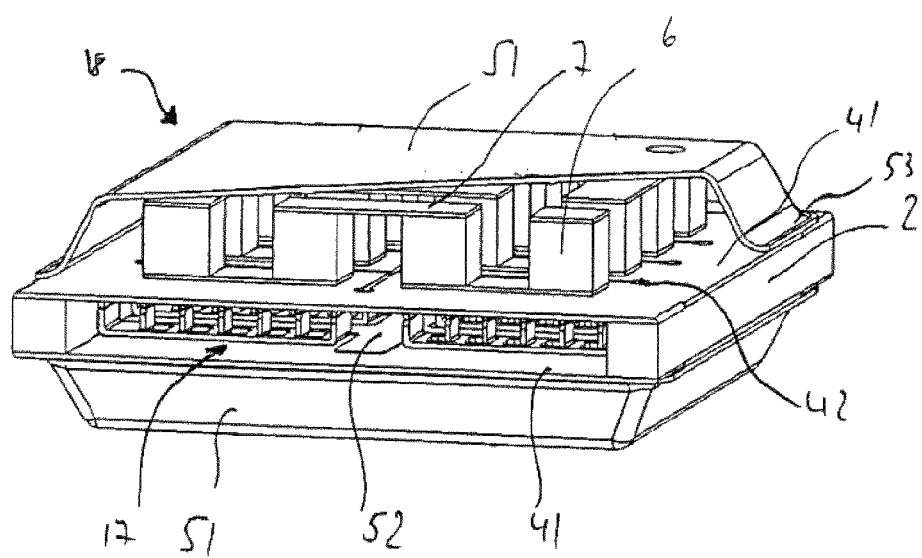
FIG. 30 shows an alternative exemplary embodiment of the thermoelectric device of FIG. 29, with an alternative embodiment of the sealing element arranged in the flow channel.

FIG. 30 shows an alternative embodiment of thermoelectric device 18, as it is shown in FIG. 29.

The structure corresponds substantially to that of FIG. 29. In contrast to FIG. 29, a sealing element 52 is now arranged on surfaces facing flow channel 17 of wall 41. Sealing element 52 is formed by a thin-walled material that seals cutout 42. Thin-walled, metallic films, for example, can be provided for the sealing element 52.

The invention being thus described, it will be obvious that the same may be varied in many ways. Such variations are not to be regarded as a departure from the spirit and scope of the invention, and all such modifications as would be obvious to one skilled in the art are to be included within the scope of the following claims.

What is claimed is:

1. A thermoelectric device comprising:
    a housing with a first wall and a second wall opposite the first wall;
    a flow channel through which a first fluid is adapted to flow, the flow channel extending through the housing between the first wall and the second wall and having side walls; and
    a thermoelectric module including a plurality of thermoelectric elements arranged within the thermoelectric module; and
    thermal decoupling elements disposed between and covered by the first wall and the second wall, the thermal decoupling elements comprising a flat body with a top surface disposed directly against a bottom of the first wall, a bottom surface disposed directly against a top of the second wall, and a throughhole at a center of the thermal decoupling elements and extending through the thermal decoupling elements from the top to the bottom, the throughhole being covered by the first wall and the second wall,
    wherein the first and the second wall have cutouts.

2. The thermoelectric device according to claim 1, wherein the flow channel is in thermal contact with the thermoelectric module.

3. The thermoelectric device according to claim 1, wherein the first wall and the second wall are formed separated from one another and are in thermal contact to one another, or wherein the first wall and the second wall are formed as a unit.

4. The thermoelectric device according to claim 1, wherein the cutouts are closed fluid-tight via a sealing element.

5. The thermoelectric device according to claim 1, wherein the housing is made as a flat tube, which is formed of plate-like elements in a stacked configuration or is made as a one-piece flat tube.

6. The thermoelectric device according to claim 1, wherein the thermoelectric elements are connected in series via conductive bridges.

7. An arrangement of one or more thermoelectric devices according to claim 1 in a heat exchanger, wherein a second fluid is adapted to flow around outer interfaces of the thermoelectric modules.

8. The thermoelectric device according to claim 1, wherein the first wall and the second wall are connected to each of the thermal decoupling elements in a fluid-tight manner.

9. A thermoelectric device comprising:
    a housing with a first wall and a second wall opposite the first wall;
    a flow channel through which a first fluid is adapted to flow, the flow channel extending through the housing between the first wall and the second wall and having side walls; and
    a thermoelectric module including a plurality of thermoelectric elements arranged within the thermoelectric module; and
    thermal decoupling elements disposed between and covered by the first wall and the second wall, the thermal decoupling elements comprising a flat body with a top surface disposed against a bottom of the first wall, a bottom surface disposed against a top of the second wall, and a throughhole at a center of the thermal decoupling elements and extending through the thermal decoupling elements from the top to the bottom, the throughhole being covered by the first wall and the second wall,
    wherein the first and the second wall have cutouts, and
    wherein the first wall and the second wall have flow resistance elements, which project into the flow channel.

10. A thermoelectric device, comprising:
    a first wall, the first wall having a first cutout at a center of the first wall, the first cutout being surrounded by the first wall;
    a second wall, opposite the first wall, having a second cutout at a center of the second wall, the second cutout being surrounded by the second wall;
    thermal decoupling elements disposed between and covered by the first wall and the second wall, the thermal decoupling elements comprising a flat body with a top surface disposed directly against a bottom of the first wall, a bottom surface disposed directly against a top of the second wall, and a throughhole at a center of the thermal decoupling elements and extending through the thermal decoupling elements from the top to the bottom, the throughhole being covered by the first wall and the second wall;
    an open flow channel disposed between the first wall and the second wall;
    a first thermoelectric module arranged on a side of the first wall facing away from the flow channel; and
    a second thermoelectric module arranged on a side of the second wall facing away from the flow channel.

11. The thermoelectric device according to claim 10, further comprising:
    a first spacing element arranged on the first wall between the first wall and the first thermoelectric module; and
    a second spacing element arranged on the second wall between the second wall and the second thermoelectric module.

12. The thermoelectric device according to claim 10, wherein the first thermoelectric module comprises a plurality of thermoelectric units connected to one another by conductive bridges.

13. The thermoelectric device according to claim 12, wherein the thermoelectric units are arranged in an interior of the thermoelectric module.

14. The thermoelectric device according to claim 10, wherein the first thermoelectric module and the second thermoelectric module each comprises a plurality of thermoelectric units connected to one another by conductive bridges.

15. The thermoelectric device according to claim 11, wherein the first spacing element has a spacer cutout, the spacer cutout being larger than the first cutout thereby creating a hollow space between the first wall and the first thermoelectric module.

16. The thermoelectric device according to claim 10, wherein at least one of the first thermoelectric module and the second thermoelectric module comprises fin elements that extend through the first cutout or the second cutout into the flow channel.

* * * * *